(12) United States Patent
Buschbeck et al.

(10) Patent No.: US 7,388,217 B2
(45) Date of Patent: *Jun. 17, 2008

(54) PARTICLE-OPTICAL PROJECTION SYSTEM

(75) Inventors: Herbert Buschbeck, Vienna (AT); Gertraud Lammer, Vienna (AT); Alfred Chalupka, Vienna (AT); Robert Nowak, Vienna (AT); Elmar Platzgummer, Vienna (AT); Gerhard Stengl, Wernberg (AT)

(73) Assignee: IMS Nanofabrication GmbH, Vienna (AT)

( * ) Notice: Subject to any disclaimer, the term of this patent is extended or adjusted under 35 U.S.C. 154(b) by 0 days.

This patent is subject to a terminal disclaimer.

(21) Appl. No.: 11/700,468

(22) Filed: Jan. 31, 2007

(65) Prior Publication Data
US 2007/0125956 A1    Jun. 7, 2007

Related U.S. Application Data

(62) Division of application No. 11/080,578, filed on Mar. 15, 2005, now abandoned.

(30) Foreign Application Priority Data

Mar. 15, 2004  (AT) ............................. A 457/2004

(51) Int. Cl.
  H01J 37/302   (2006.01)
  H01L 21/027   (2006.01)
(52) U.S. Cl. .............................. 250/492.23; 250/492.22
(58) Field of Classification Search ...................... None
    See application file for complete search history.

(56) References Cited

U.S. PATENT DOCUMENTS

| | | |
|---|---|---|
| 3,851,172 A | 11/1974 | Ozasa et al. |
| 4,967,088 A | 10/1990 | Stengl et al. |
| 4,985,634 A | 1/1991 | Stengl et al. |
| 5,260,579 A | 11/1993 | Yasuda et al. |
| 5,834,783 A * | 11/1998 | Muraki et al. .............. 250/398 |
| 5,894,132 A | 4/1999 | Nakasuji et al. |
| 5,912,469 A | 6/1999 | Okino |
| 6,087,669 A | 7/2000 | Suzuki |
| 6,538,721 B2 | 3/2003 | Okita et al. |
| 6,608,308 B1 | 8/2003 | Takagi et al. |
| 6,768,125 B2 | 7/2004 | Platzgummer et al. |
| 7,084,411 B2 * | 8/2006 | Lammer-Pachlinger et al. ....................... 250/492.1 |
| 2003/0043358 A1 | 3/2003 | Suganuma et al. |
| 2005/0201246 A1 * | 9/2005 | Buschbeck et al. ......... 369/101 |

FOREIGN PATENT DOCUMENTS

| | | |
|---|---|---|
| GB | 2339960 | 2/2000 |
| JP | 2004158630 | 6/2004 |

* cited by examiner

OTHER PUBLICATIONS

International Search Report for Application No. GB 0501353.7, dated May 4, 2005.

*Primary Examiner*—Jack I Berman
(74) *Attorney, Agent, or Firm*—RatnerPrestia

(57) ABSTRACT

In a particle-optical projection system a pattern is imaged onto a target by means of energetic electrically charged particles. The pattern is represented in a patterned beam of said charged particles emerging from the object plane through at least one cross-over; it is imaged into an image with a given size and distortion. To compensate for the Z-deviation of the image position from the actual positioning of the target (Z denotes an axial coordinate substantially parallel to the optical axis), without changing the size of the image, the system includes a position detector for measuring the Z-position of several locations of the target, and a controller for calculating modifications of selected lens parameters of the final particle-optical lens and controlling said lens parameters according to said modifications.

9 Claims, 14 Drawing Sheets

PARTICLE-OPTICAL PROJECTION SYSTEM

CROSS REFERENCE TO RELATED APPLICATIONS

This application is a Divisional Application of U.S. patent application Ser. No. 11/080,578, filed Mar. 15, 2005, now abandoned which claims priority from Austrian Patent Application No. A 457/2004, filed Mar. 15, 2004.

FIELD OF THE INVENTION AND DESCRIPTION OF PRIOR ART

The invention relates to the field of particle-optical projection systems and, in particular, to the adjustment of the field position along the optical axis with the actual position of the target in a particle-optical projection system without a change of magnification or image quality. More in detail, the invention relates to the improvement of a particle-optical projection system for imaging a pattern onto a target by means of energetic electrically charges particles in a particle-beam exposure apparatus, adapted to produce, from the pattern positioned at an object plane and represented in a patterned beam of said charged particles emerging from the object plane through at least one cross-over, an image at the position of the target, with said image having a given size and distortion.

In systems of this kind, the Z-position of the image plane, i.e. the position as measured along the direction of the particle beam, must coincide with the target position within a certain Z-tolerance determined by the depth of focus ($D_oF$) of the projection system. For a typical ion-optical device, the Z-tolerance is in the order of a few um or even lower. For an electron-optical apparatus the tolerance is generally smaller because, due to the higher diffraction of electrons, a larger numerical aperture is needed which reduces the $D_oF$.

The target of such a system, e.g. a silicone wafer, may display individual geometric properties which differ from the ideal plane at a specified position. For instance, a wafer may be bulged or otherwise distorted due to inner stress, or may have an increased or decreased thickness varying over the surface of the wafer. An uncertainty in the position of the stage to which the wafer is mounted does also lead to deviating target positions.

Furthermore, in systems such as multibeam systems, which comprise a wafer stage moving during image exposure, the Z-position of the target will vary according to the tolerance of the wafer stage movement. This can easily surmount the allowed tolerance of the Z-position for a semiconductor production equipment.

Furthermore, the invention refers to the effect of Coulomb interactions on the position of the image plane (image field). When the intensity of the patterned particle beam varies, the focusing characteristics of a particle beam are affected by the Coulomb interactions within the beam. Often, the pattern varies in time with different values of overall transparency according to a motion of the (virtual) image frame on the target during the exposure process, usually in a sort of a scanning motion over the target surface The Coulomb interactions are usually classified into stochastic interactions, which arise from the fact that the particle beam actually consists of randomly distributed particles and cause an increase of the blur of the image, and space charge effects, due to the space charge of the beam acting on itself as a whole. The space charge acts like a continuous dispersive lens, changing the focusing properties of the system and thereby changing the position of the image plane The effect of space charge is particularly disturbing in a multibeam system like the so-called PML2 apparatus described in the US-2003-0155534-A1 (=GB 0300693.9=JP2003-45145) of the applicants. In such an apparatus the beam is composed of a large number of beamlets whose intensities are individually switched between zero and full value. The pattern to be imaged and, as a consequence, the total current (which corresponds to the sum over all beamlets) as well as the current distribution within the beam varies at a MHz rate. Without correction or compensation, the space charge effect will vary at the same rate, with the result that not only the image position, but also the magnification and distortion will continuously change, thereby increasing the image blur as well as the image distortion.

In the PLM2, at a maximum current of 10 µA through the optical column, due to space charge the shift of the image position towards larger Z (i.e., defocusing) may take values between 0 and about 100 µm. The allowed tolerance of the Z-position in this application is given by the resolution requirements and the related depth of focus and is smaller than 1 µm. While the magnification is also changed by space charge, the amount of magnification change is generally not directly coupled to the amount of defocusing.

The problem of varying target positions has been addressed in the state of the art. For instance, according to Okita et al. in the U.S. Pat. No. 6,538,721, the Z-position of the target can be measured online.

In the U.S. Pat. No. 5,260,579, Yasuda et al. propose to correct for the influence of the fast varying space charge effect in a multi-beam system by refocusing, i.e., adjustment of the focal length of the final lens, according to the momentary total beam current. These approaches are, however, not appropriate in projection optical imaging systems, as the magnification is affected by a variation of the focal length as well. Moreover, the space charge effect will also cause different current density distributions within the particle beam to lead to different image distortions.

SUMMARY OF THE INVENTION

It is a goal of the present invention to provide a way to arbitrarily change image position and magnification, so as to compensate for deviations between the image position and the target position with respect to the axial direction (Z-direction), which may be due, in particular, to the individual geometrical properties of the target and the space charge effect of the current through each momentary pattern, taking into account the dependence of these imaging characteristics caused by the pattern distribution and the total illumination current density. A primary task to be solved is to move the optical image plane as required, i.e. to "refocus", but to keep the value of the demagnification constant in order to comply with the requirements (typically to $\Delta M/M = 1 \times 10^{-5}$). Furthermore, the image distortion shall be minimized, also in connection with varying space charge effect.

In a first aspect of the invention, the above goal is reached by a particle-optical projection system as set forth in the beginning, further comprising a position detection means for measuring the Z-position of several locations of the target (with Z denoting a coordinate taken along a direction substantially parallel to the optical axis of the projection system), as well as a control means adapted to calculate modifications of selected lens parameters of the final particle-optical lens of said projection system and control said lens parameters according to said modifications, with said modifications being suitable to compensate for the Z-deviation of the image position from the actual positioning of the target as determined from said Z-position measurements, without changing the size of the image.

This solution allows for a simple way to deal with issues of Z-positioning of the target, which also will allow to compensate for the geometry fast. Thus, the invention makes a high throughput possible, in contrast to prior-art arrangements where an insufficient Z-positioning could severely obstruct the performance of a product line. For most applications one lens parameter will be sufficient to effect the desired modification; if appropriate, more lens parameters of the lens, or lens parameters of several lenses, can be modified.

In a preferred development of the invention, which enables to compensate also for other imaging defects, the control means is further adapted to calculate a beam current value corresponding to the entire patterned beam, and calculate modifications of selected lens parameters of the final particle-optical lens, with said modifications being suitable to additionally compensate for the influence of said beam current value upon the geometric imaging properties of the projection system.

One possibility to realize the Z-compensation is by means of an electromagnetic lens having, in a common pole-casing of magnetic material, at least two electroconductive coils which are situated at different positions within the lens and to which different electric currents are applicable, wherein the control means is adapted to calculate modifications of the electric currents fed to said electroconductive coils suitable to compensate for the Z-deviation of the actual positioning of the image from the positioning of the target, and control the electric currents fed to said electromagnetic coils according to said modifications. The electromagnetic lens may comprise, for instance, two electroconductive coils of corresponding size whose positions are different with respect to the direction parallel to the particle beam; or the electromagnetic lens may have a first electroconductive coil which is fed a first electric current and at least one second electroconductive coil fed a second electric current, with the absolute value of the second electric current being smaller than the first electric current by at least an order of magnitude.

Another possible way to implement the Z-compensation aims at an electrostatic lens, in particular an electrostatic Einzel lens having an initial electrode, at least two central electrodes and a final electrode, wherein the central electrodes are adapted to be fed different electrostatic potentials, wherein the control means is adapted to calculate modifications of the electric potentials of said central electrodes suitable to compensate for the Z-deviation of the actual positioning of the image from the positioning of the target, with the difference between the potentials of the central electrodes being smaller than the difference between the potential of one of the central electrodes to the potential of the initial and the final electrode by at least an order of magnitude, and control the electric potentials of the central electrodes according to said modifications.

Yet another possibility is mechanical shifting, namely, a particle-optical lens provided with adjustable positioning means, e.g. piezoelectric actuators, for adjustment of the axial position of the lens as measured along the optical axis of the projection system, wherein the control means is adapted to calculate modifications of the axial position of said lens suitable to compensate for the Z-deviation of the actual positioning of the image from the positioning of the target, and control said axial positions according to said modifications by means of said positioning means.

According to a second aspect of the invention, a particle-optical projection system as set forth in the beginning, further comprising a multi-beam pattern definition means for defining the patterned beam with a time-variable pattern, has an aperture array means having a plurality of apertures defining the shape of beamlets permeating said apertures and at least one deflector array means separate from the aperture array means, with said deflector array means having a plurality of openings surrounding the beamlets, wherein for each opening or group of openings are provided at least two deflecting electrodes to which different electrostatic potentials are applicable, thus correcting the path of the beamlet(s) passing through the respective opening according to a desired path through the device, wherein at least one of said deflector array means is adapted to adjust the angles of the beamlets passing the apertures to minimize the aberration of the crossover.

This aspect of the invention bases on the observation that the distortion due to the space charge effect of a beam with homogeneous current can be minimized by appropriate choice of the angles of the beamlets leaving the apertures.

In a preferred development of the invention, the deflector array means is positioned immediately before the aperture array means.

It is further advantageous when the deflector array means is adapted to produce a virtual object different from the object as defined by the apertures of the aperture array means. This enables to correct for various defects that may occur, in particular deviations of the transfer function and distortion of the projection optical system.

In order to circumvent imaging problems arising, e.g., from Coulomb interactions and curvature aberration, it is advantageous to re-shape the crossover to a desired degree of aberration. To this end, the multi-beam pattern definition means may comprise a first deflector array means which is adapted to adjust the angles of the beamlets passing the apertures to minimize 'the aberration of the crossover, a second deflector array means which is adapted to produce a virtual object different from the object as defined by the aperture, and said first and second deflector array means adjust the position of the virtual object and the angles of the beamlets independently from each other.

In particular, the modifications of said deflecting electrode potentials may be calculated to compensate for the beam current influence upon the axial position of the image and the size of the image, and/or to additionally compensate for the beam current influence upon the distortion of the image.

Also with this aspect of the invention, the above-mentioned electrostatic Einzel lens and/or a mechanically adjustable lens may be used.

BRIEF DESCRIPTION OF THE DRAWINGS

In the following, the present invention is described in more detail with reference to the drawings, which schematically show.

DETAILED DESCRIPTION OF THE INVENTION

Figure 1:
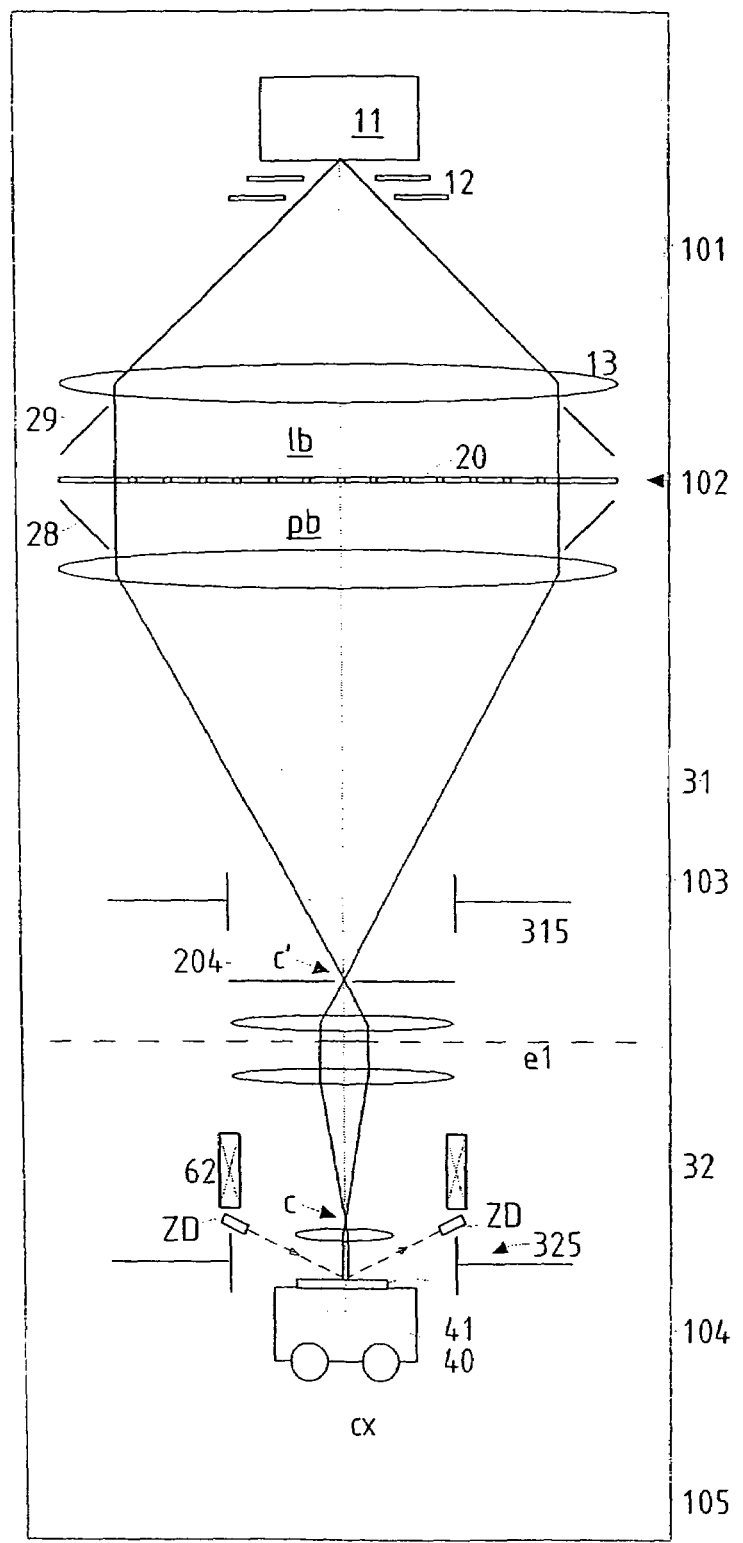
FIG. 1 an overview (longitudinal section) of an ion-optical lithography apparatus with a Z-position detection and Z-position compensation according to the invention.

The preferred embodiments of the invention discussed in the following are suitable for use in the PLM2 apparatus mentioned above which has a two-stage demagnifying projection optical system after the pattern definition device which produces the patterned beam. FIG. 1 shows a schematic overview of the PLM2 apparatus inasmuch as needed for the disclosure of the present invention. For further details about the PLM2 system, the reader is referred to the US-2003-0155534-A1.

In the following, with reference to FIG. 1 (which was taken, with modifications where appropriate, from the US-2003-0155534-A1) we first discuss the technical background of the PLM2 apparatus and the Pattern Device (PD) device it contains, as far as relevant to the invention. It should be appreciated that the invention is not restricted to the embodiment discussed in the following, which merely represents one of the possible implementations of the invention.

An overview of a lithographic apparatus employing the preferred embodiment of the invention is shown in FIG. 1. In the following, only those details are given as needed to disclose the invention; for the sake of clarity, the components are not shown to size in FIG. 1. The main components of the lithography apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons these can be, for instance, hydrogen ions or heavier ions.

The extraction system 12 accelerates the particles to a defined energy of typically several keV, e.g. 10 keV. By means of a condenser lens system 13, the particles emitted from the source 11 are formed into a wide, substantially telecentric particle beam serving as lithography beam lb. The lithography beam lb then irradiates a PD device 20 which, together with the devices needed to keep its position, form the PD system 102 The PD device 20 is held at a specific position in the path of the lithography beam lb, which thus irradiates a plurality of apertures present in the PD device 20 (for further details on the arrangement and operation of the apertures, see the US-2003-0155534-A1). Some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20). The PD device 20 is cooled by means of cooling plates 28, 29.

The pattern as represented by the patterned beam pb is then projected by means of an electro-magneto-optical projection system 103 onto the substrate 41 where it forms an image of the switched-on mask apertures. The projection system 103 implements a demagnification of, for instance, 200× with two crossovers c, c'. The substrate 41 is, for instance, a silicon wafer covered with a photo-resist layer. The wafer 41 is held and positioned by a wafer stage 40 of the target station 104.

The apparatus 100 may further comprise an alignment system (not shown), which allows to stabilize the position of the image of the mask apertures on the substrate with respect to the particle-optical system by means of reference beams which are formed in the PD system by reference marks at the side of the PD field; the principles of an alignment system are described in the U.S. Pat. No. 4,967,088. For instance, a lateral correction of image position and distortion can be done by means of multipole electrodes 315, 325; additionally, a magnetic coil 62 can be used to generate a rotation of the pattern in the substrate plane.

In the embodiment of the invention shown in FIG. 1, the projection system 103 is composed of two consecutive electro-magneto-optical projector stages 31, 32. The lenses used to realize the projectors 31, 32 are shown in FIG. 1 in symbolic form only, as technical realizations of particle imaging systems are well known in the prior art, such as, for instance, the U.S. Pat. No. 4,985,634 (=EP 0 344 646) of the applicant. The first projector stage 31 images the plane of the apertures of the device 20 into an intermediate plane e1 which in turn is imaged onto the substrate surface by means of the second projector stage 32. Both stages 31, 32 employ a demagnifying imaging through crossovers c, c'. The demagnification factor for both stages is chosen such that an overall demagnification of several hundred results, e.g.

200×. A demagnification of this order is in particular suitable with a lithography setup, in order to alleviate problems of miniaturization in the PD device. A stop plate 204 may be provided at, for instance, the position of a crossover c', in order to block out beam components which are deflected off the regular beam path.

In both projector stages the respective lens system is well compensated with respect to chromatic and geometric aberrations; furthermore, a residual chromatic aberration of the first stage 31 can be compensated by suitable fine correction in the second stage 32.

As a means to shift the image as a whole laterally, i.e. along a direction perpendicular to the optical axis cx, deflection means 315, 325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system.

These deflection means 315, 325 are not to be confused with the deflection array means of the PD device (see below), since the former only deal with the particle beam as a whole.

Figure 2:
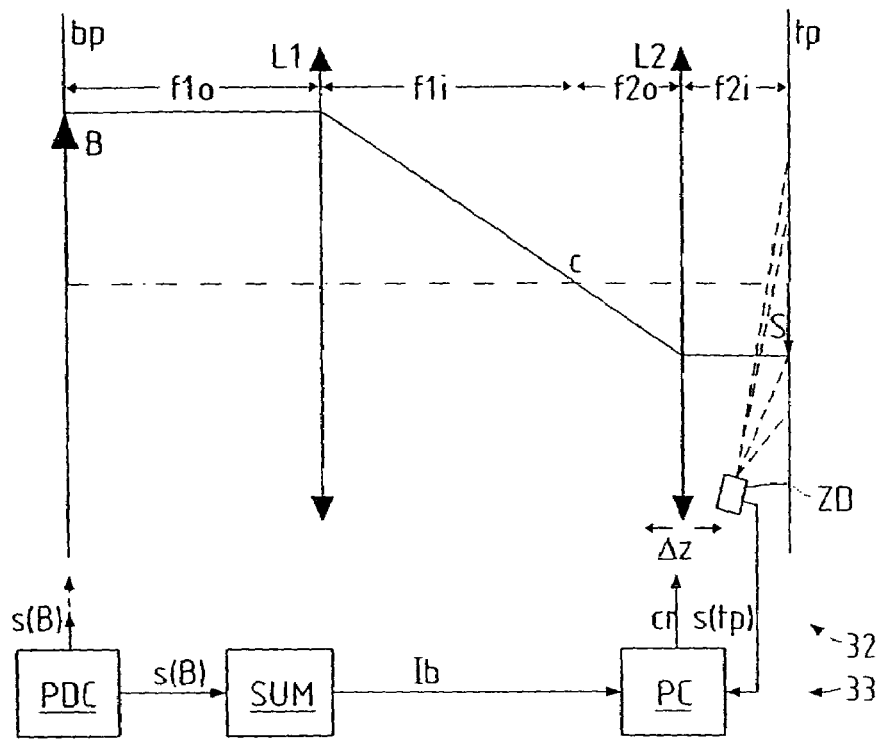
FIG. 2 a detail of the second projection stage of the apparatus of FIG. 1.

FIG. 2 shows a simplified schematic representation of the second stage 32 with a crossover c; for the purpose of the disclosure of the invention, it is sufficient to discuss the second stage of the projection optical system only, and treat the first stage as fixed. Since the beam diameter is well reduced in the second stage as compared to the first stage, the beam current effects are far more prominent in the second stage, so the first stage can be left without a beam current compensation; of course, if needed, also the first stage may be provided with a beam current compensation according to the invention.

The second stage 32 is realized as a lens system, in the present example a doublet lens system with two lenses L1, L2, which modifies an incoming patterned beam from an object B (which in this special case is an intermediate image formed by the previous stage) situated in an object plane bp (corresponding to plane el of FIG. 1) into an image S whose position is characterized by an image field sp which, ideally, should coincide with the target plane tp on a substantially plane substrate. FIG. 2 shows one "telecentric" ray at the edge of the patterned beam.

In real systems, the image field sp always exhibits deficiencies with respect to the desired imaging onto the target. One major type of deficiency is due to a mis-alignment between the (actual) image field position and the (actual) target position. While the lateral alignment of image and target in particle-optical devices is a well-known issue which has been addressed and solved by so-called alignment procedures such as proposed in the U.S. Pat. No. 4,967,088, also the axial alignment may be problematic, in particular if the shape of the target is not ideally plane but bent or bulged due to mechanic stress or the like. Another type of deficiency is due to the deviation of the geometry of the image field from an ideal plane ("image plane"), typically resulting in a field curvature, in combination with a curvature of the target. The deficiencies discussed here are only slight, but in view of the minute structures to be produced and the high demands with regard to the precise definition of the structures in semiconductor production, they may still be sufficient to cause blurring of the imaged structures at some regions of the target when other regions (for instance the center) of the target receive a sharp image.

Furthermore, as explained in the introduction, the wafer stage may be misplaced with respect to its expected position. Moreover, the image position may be shifted along the Z-direction by the space charge effect, with the amount of Z-shift ("defocusing") depending on the total current of the patterned beam. The dependence of the Z-shift on the beam current value should be established by calibration experiments for a given projection system preceding its operation, such that during operation, the required Z-correction can be deduced from measurement or calculation of the beam current using the calibration data.

A position detection device ZD is provided for detection of the axial position of the target, which is output as a signal s(tp) for further processing. A suitable position detection device is disclosed by Okita et al. in the U.S. Pat. No. 6,538,721, which uses an illumination light that does not effect development of the resist.

The two consecutive lenses L1, L2, which for the purpose of this disclosure can be assumed as ideally thin, generate a demagnified image of the object B. If the object is positioned in the object focal plane of the first lens L1, which has focal object length f1$o$, and the image focal plane (focal image length f1$i$) of the first lens coincides with the object focal plane of the second and final lens L2, with focal length f2$o$, the demagnification M of the system is given by M=−f1$i$/f2$o$; and the image is created in the image focal plane of the second lens L2.

In a typical example, the nominal values of the focal distances are f1:=f1$o$=f1$i$=200 mm, and f2:=f2$o$=f2$i$=30mm. (For clarity, the dimensions in FIG. 2. are not to scale.) A change of f2 by a small deviation $\Delta$b results in a movement of the image position by the same amount, but, at the same time, also in a change of the magnification. In a magnetic lens, the focal length is modified by variation of the current in the coil; in an electrostatic lens by changing the electrode potential(s). Increasing f2 by 1 μm already causes a relative magnification change of $3\times10^{-5}$. Therefore, if the need arises to shift the image plane by 1 μm or more without affecting the magnification, it is not sufficient to change the focal length f2$o$ of the final lens L2 since this would also change the magnification accordingly.

In the doublet system of FIG. 2, for ideal lenses without aberrations ("Gauss dioptrics") a shift of the image position by an offset $\Delta$z without change of magnification can be obtained by shifting the whole second lens L2 by $\Delta$z; in other words, the principal plane of this lens is shifted. If, at the same time, the magnification has to be changed independently, an appropriate combination of principal plane shift and change of focal length will be chosen.

The repositioning of the lens L2, or in general the modification of the lens parameters, is controlled by a controlling device 33, which forms part of the controller system (not shown for the sake of clarity) needed to control the lithography apparatus 100. The controlling device 33 takes the signal s(B) which is used in a pattern definition control PDC to generate the pattern (in this case indirectly, as the object B is actually the image of the pattern) as explained in the US-2003-0155534-A1. From the signal s(B), a beam current value Ib is calculated, for instance in a (digital or analog) summer SUM which adds all transparency values of the apertures in the pattern definition signal s(B). The device 33 also accepts as input the output signal s(tp) from the Z-position measurement of the target. Based on the target Z-position s(tp) and the beam current value Ib, a parameter controller PC generates a correction signal cr which corresponds to the modification of the lens parameters to be corrected, in this case for effecting an axial geometric offset $\Delta z$ of the lens principal plane. The conversion of the input parameters, such as the target Z-position and the beam current value Ib, into correction values for the lens parameters is done by interpolation of the calibration data determined in the before-hand calibration measurements mentioned above. The correction signal cr is fed to the appropriate components of the lens to effect the desired modification of the lens parameters.

Figure 3A:
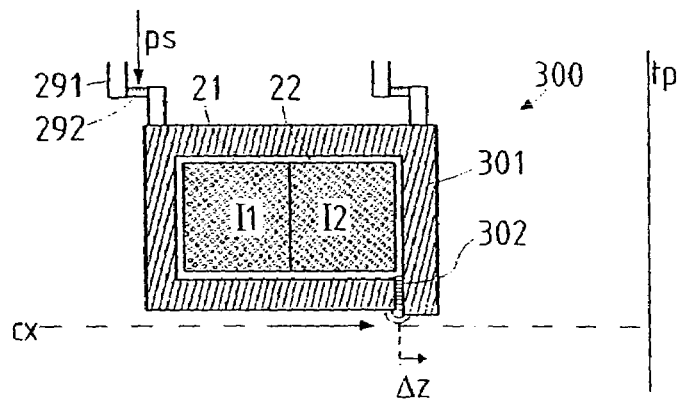
FIGS. 3a and 3b two variants of a magnetic lens with adjustable Z-position.

One method to achieve this shifting is to physically move the lens L2 by the needed amount $\Delta z$ along the Z-direction (parallel to the optical axis) to change the position of the image plane. This is shown in FIG. 3a for the case of an electromagnetic lens 300 realizing the lens L2 of FIG. 2. In FIG. 3a the upper half of the cross section of the electromagnetic lens 300 is shown; the lens is rotationally symmetric around the optical axis cx. The lens 300 is mounted on a mounting system 291 which includes piezoelectric actuators 292. The piezo actuators are controlled by a piezo signal ps which, as a specific example of the correction signal cr discussed above, is generated by the parameter controller PC and corresponds to the desired axial geometric offset $\Delta z$. By virtue of the piezo signal, the piezo actuators 292 shift the whole magnetic lens 300 along the axial direction. If the lens is realized as an electrostatic lens, the whole lens or only an electrode of the electrostatic lens may be moved in such a manner.

FIG. 3a also illustrates a second realization of the invention, namely, splitting of the coils of an electromagnetic lens 300. Electric current flows through the coils 21, 22, with the flowing direction perpendicular to the drawing plane. The coils are held in an iron casing 301 which serves as a pole-casing with a gap 302. Magnetic fluxlines induced by the currents I1, I2 permeating the coils 21, 22 are permeating the casing 301, traversing the gap 302. Due to the gap 302 the magnetic flux extends to the beam path (around the optical axis cx). It is the magnetic flux that acts as magnetic lens, whose principal plane(s) lie within the gap and whose focal length(s) is (are) determined by the shape and value of the axial magnetic field. Lenses of prior art only had one coil in place of the two coils 21, 22, and the operation of that one coil would correspond to operating both coils 21, 22 with the same current I0=I1=I2; a change of this current I0, and thereby of the magnetic flux, changes the focal length(s) of the lens (proportional to the square of the current), but not the position of the principal plane(s) since the geometrical configuration of the field is not affected.

In order to shift the principal plane, the magnetic lens 300 is provided with two coils, for instance two partial coils 21, 22 of equal size and corresponding shape, which can be operated with respective currents I1, I2 that can be chosen individually. The direction of the currents I1, I2 is the same (e.g., into the plane of drawing). The currents I1, I2 are generated by current sources which are controlled by the control device PC (FIG. 2).

In a practical case with two consecutive lenses L1, L2 as in FIG. 2, with the final lens L2 realized as the magnetic lens 300 of FIG. 3a, the focal length of the first lens L1 is $f1o=f1i=420$ mm. The total excitation, i.e. current times number of turns, through the magnetic lens 10 is, for instance, Itot=18000 Ampere-turns, which yields a focal length of $f2o=f2i=30$ mm. The image plane tp is at a distance of 30 mm from the principal plane pp, and the demagnification $M=-f1/f2=-14$.

If the whole excitation Itot is sent through only the first coil 21, the image plane is shifted by about $-155$ μm, where the negative sign denotes a shift against the direction of the beam, away from the target. In order to keep the demagnification at its original value, the total current has to be decreased, namely by $\Delta \text{Itot}=-0.14\%$.

If, on the other hand, the whole Itot is sent through the second coil 22, the image plane is shifted by about 130 μm, i.e., towards the target. To keep the demagnification at its original value, the total current has to be increased, namely by $\Delta \text{Itot}=0.17\%$. Evidently, the asymmetry between the two otherwise symmetric coils 21, 22 arises from the asymmetric design of the magnetic lens 300.

As becomes clear from this discussion, a quadratic dependence of the current correction $\Delta \text{Itot}$ through each of the coils 21, 22 as a function of the desired image plane shift is established, under the condition that the magnification is kept constant. For instance, if an image plane shift of $\Delta z=-25$ μm is required, the required current partition becomes about I1=58.76%, and I2=41.22%; whereas, for an image plane shift of $\Delta z=+25$ μm, the required current partition becomes about I1=41.00%, and I2=59.04%.

It should be noted that the actual precision of the current/excitation is required to at least one digit more than indicated in the above examples in order to keep the magnification constant to within $1\times10^{-5}$.

Figure 3B:
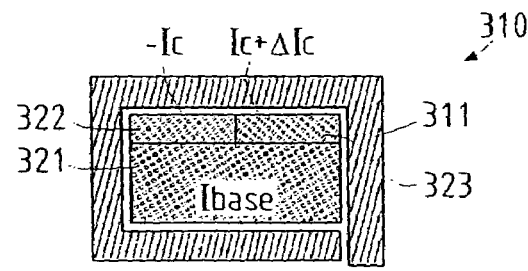

FIG. 3b shows another preferred embodiment 310 of a magnetic lens with an electromagnetic coil arrangement offering an improved accuracy in current/excitation control. A basic or main coil 321 extends over the whole usable width within the pole shoe material 311, operated at a constant set value Ibase of the current. Two subsidiary coils 322, 323, are positioned surrounding the main coil 321, basically conducting the same amount of current but in different directions. In the following, the current values through the coils are given expressed relative to the current value through the main coil for an image plane shift $\Delta z=+25$ μm.

Preferably, the subsidiary coils 322, 323 may be exactly the same size but wound in opposite directions, and electrically connected. One common supply is then used for both coils, providing the "common" (but opposite) contributions Ic for the two coils in order to shift the image plane, e.g. 9% of the current fed to the main coil 321. In addition, a separate supply may be connected to one of the two coils, e.g. to the right one, which provides an additional current by which the current Ic+$\Delta$Ic through the coil 323 deviates from the opposite value of the current $-$Ic of the coil 322; e.g. $\Delta \text{Ic}=+0.04\%$. Since the value of this additional current is very small, but also very important to keep the magnification constant, it is much easier to be controlled on a separate supply than together with the main excitation current If, in addition to a correction of image plane, also a correction of magnification is required, the current through all the coils has to be changed by an identical relative amount, which leads to a change of focal length of the lens.

Figure 4:
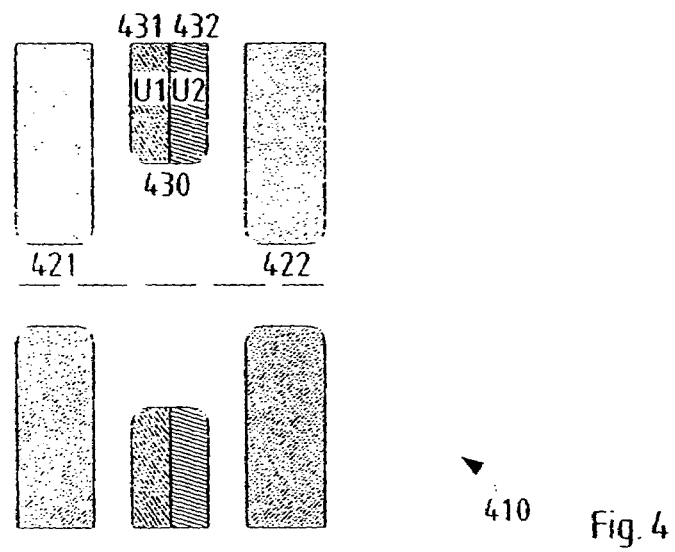
FIG. 4 an Einzel lens with adjustable Z-position.
Figure 18:
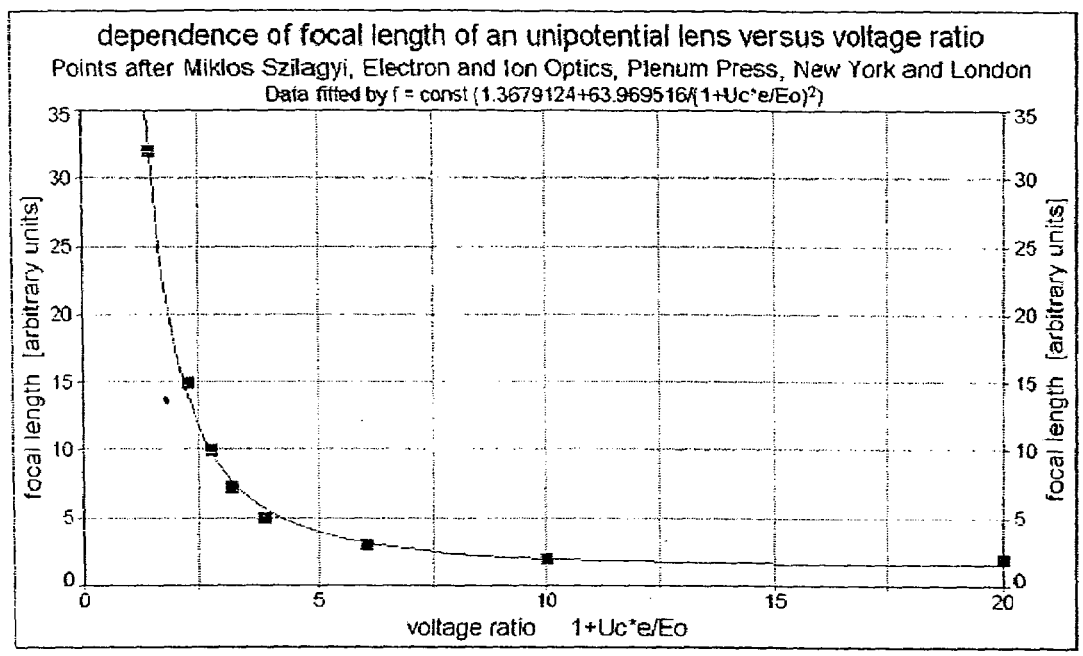
FIG. 18 shows the dependence of the focal length of an unipotential lens as a function of the voltage ratio.

Another realization of the invention, namely, for an electrostatic lens, is shown in FIG. 4. An electrostatic Einzel lens 410 comprises two identical boundary electrodes 421, 422 and a central, symmetric electrode 430. The boundary electrodes 421, 422 are held at the same potential, e.g. Uo=0 V, the central electrode 430 at a different, e.g. accelerating, potential Uc. Assuming a thin lens, for a given incoming particle energy Eo, this system acts as a lens with its principal plane in the center and a given focal length fo (the exact value also depending on the geometry of the lens). Changing the potential Uc by $\Delta$Uc changes the focal length:

FIG. 18 shows the dependence of the focal length of an unipotential lens as a function of the voltage ratio 1+Uc/Eo according to M. Szilagyi, 'Electron and Ion Optics', Plenum Press, page 365.

In order to change the position of the principal plane, the central electrode 430 is split into two identical parts 431, 432 along a plane perpendicular to the optical axis cx; an insulator sheet is inserted between the two half electrodes 431,432. The voltage applied to one part is, e.g., U1=Uc+ΔUc, the voltage applied to the second part is U2=Uc−ΔUc. In this way, the potential distribution within the lens becomes asymmetric, and as a consequence the principal plane is shifted towards the electrode with the higher (accelerating) potential.

Figure 5:
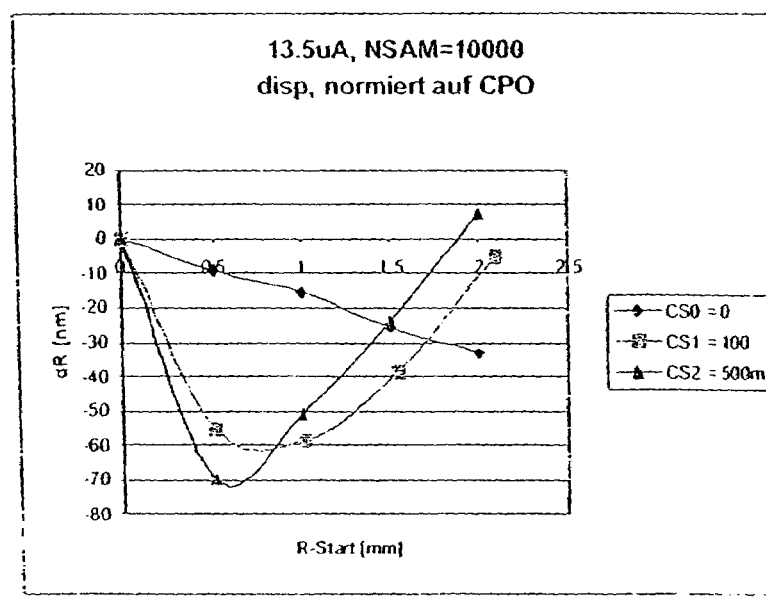
FIG. 5 the radial displacement of the image caused by global space charge effect.
Figure 6:
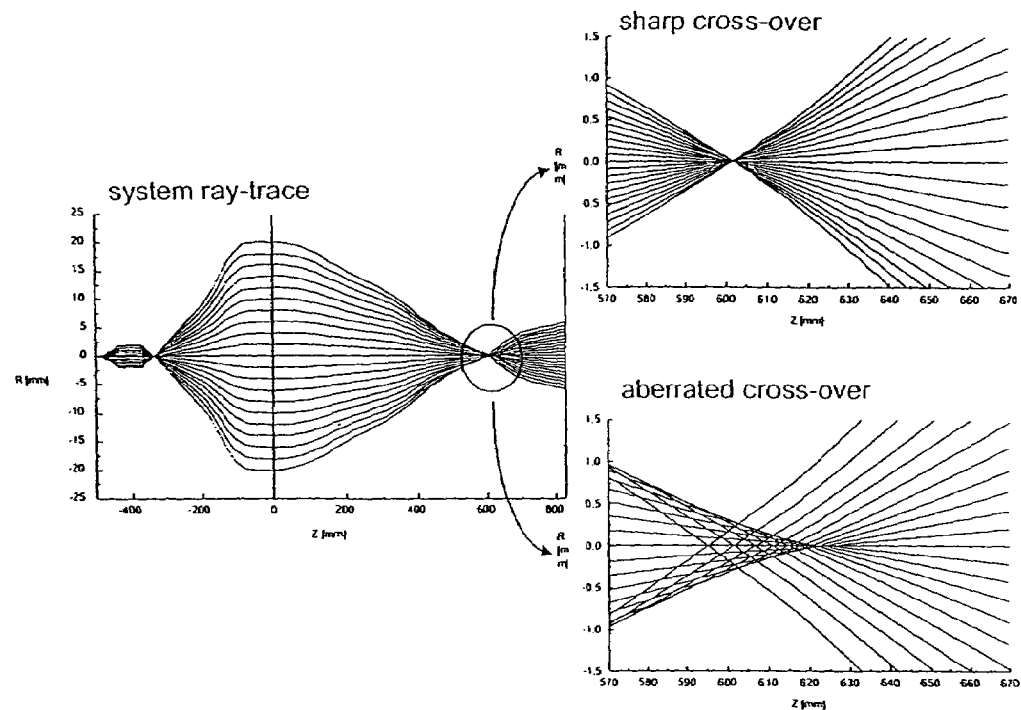
FIG. 6 the beam path through the crossover, for an aberrated crossover and a homogenized crossover.

In a particle-optical projection system, where a pattern is imaged by a substantially axially symmetric and homogeneous particle beam, the magnification and the image position will be changed by space charge. Whereas the magnification change may be positive or negative, the image position change due to defocusing is always positive. In optical systems with spherical aberration, the image distortion is also changed by space charge. This is illustrated in FIG. 5, which shows the radial displacement dR (in nanometers). of the image at the image plane as caused by global space charge as a function of the radial distance R (in millimeters) from the optical axis, for different spherical aberrations. The curve labeled CS0 corresponds to a "homogeneous" (sharp) crossover, and the curves CS1, CS2 to spherical aberration coefficients of 100 m and 500 m, respectively, resulting in less or more aberrated ("non-homogeneous") crossovers. The meaning of the terms 'aberrated crossover' and 'sharp crossover' are illustrated in FIG. 6.

In an optical system with spherical aberration, i.e. a "non-homogeneous" crossover, the space charge effect leads to increased distortion of the image. The mentioned PML2 system disclosed in the US-2003-0155534-A1 uses a two-stage optical system, with two crossovers, for instance having a total demagnification of 200, each stage demagnifying by about a factor of 14. Therefore, the stochastic and global effects of the first stage are reduced by a factor 14 and practically negligible. Only the second crossover (second stage) has to be considered.

It is recalled that the PD device 20 comprises a multitude of apertures, each of which defines a beamlet which, if the corresponding aperture is switched on, is directed and imaged to the target. In multi-beam systems like the PML2, it is possible to minimize the effect of spherical aberration of the lens on the crossover, i.e. to "homogenize" the crossover, by re-direction of each single beamlet already at the position of the object to be imaged. If this is accomplished, varying space charge only results in change of magnification and image position and can be treated by the measures described above. Note that the redirection is independent of the current, only a function of the lens properties and, of course, of the angular distribution of the beam delivered by the illumination system.

To change the direction of the beamlets, an adjustment unit 502 as described below with FIG. 8 can be used; all deflection units may be integrated in one or two such adjustment plates. It would also be possible to integrate it into the blanking plate of the PD device if space allows. One or more adjustment units for redirecting the beamlets may be provided in the pattern definition (PD) device (FIGS. 12 and 13).

Figure 7:
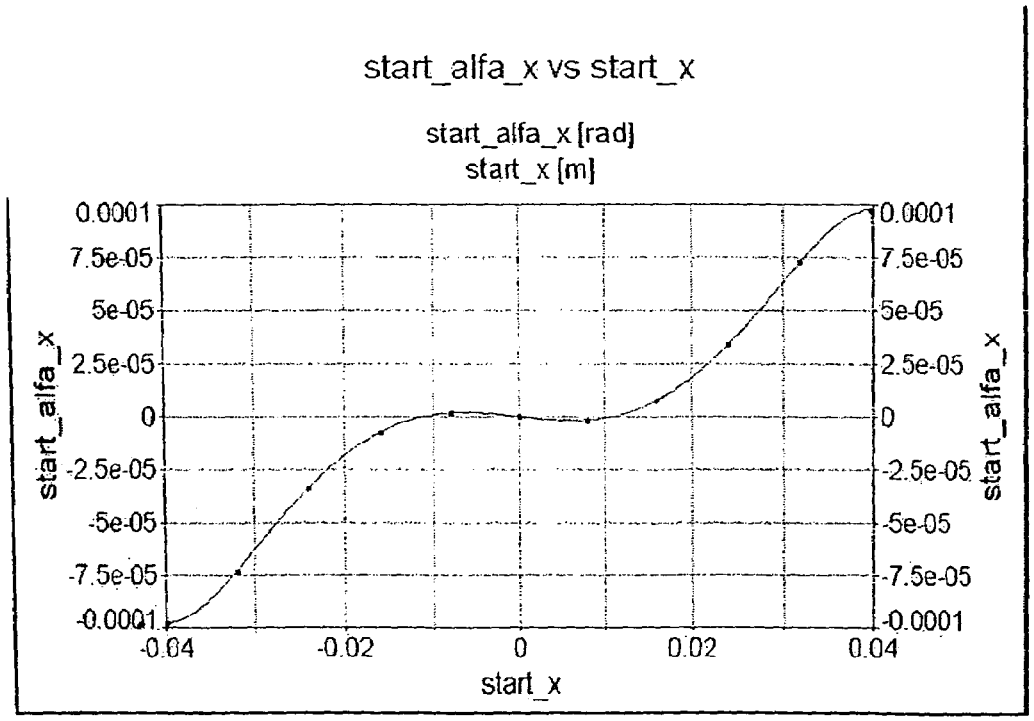
FIG. 7 the angular correction for a multi-beam array for homogenizing a crossover.

The required angular correction of the beamlets can be calculated or measured: FIG. 7 shows an example of a calculated correction required at the position of the beamlet defining apertures to "homogenize" the crossover and yield a distortion free space charge effect. The graph of FIG. 7 displays the angle of the beam correction (corresponding to angle $\theta_2$ of FIG. 12) as a function of the distance of the aperture from the center of the PD device. In FIG. 8, a simplified variant is shown having only one adjustment unit 502, positioned immediately in front of the aperture plate 203. The adjustment u n its serve to control the path of the beamlets bm as they travel along the set of openings 210, 220, 230, 250 of the PD system 102, thus taking into account the effects of, and correcting for, possibly non-perfect matching of the components of the whole apparatus 100 with the PD device and/or the alignment of components (plates) of the PD device to each other, as well as dimensional deviations of the PD device components, in particular those that will occur due to fabrication and mounting tolerances. Also, some optical aberrations like the image distortion and field curvature can be reduced as well as the image distortion caused by the global space charge effect. In the embodiment shown, up to three adjustment units are present; in other embodiments of the invention, any suitable combination of adjustment units could be implemented.

Figure 8:
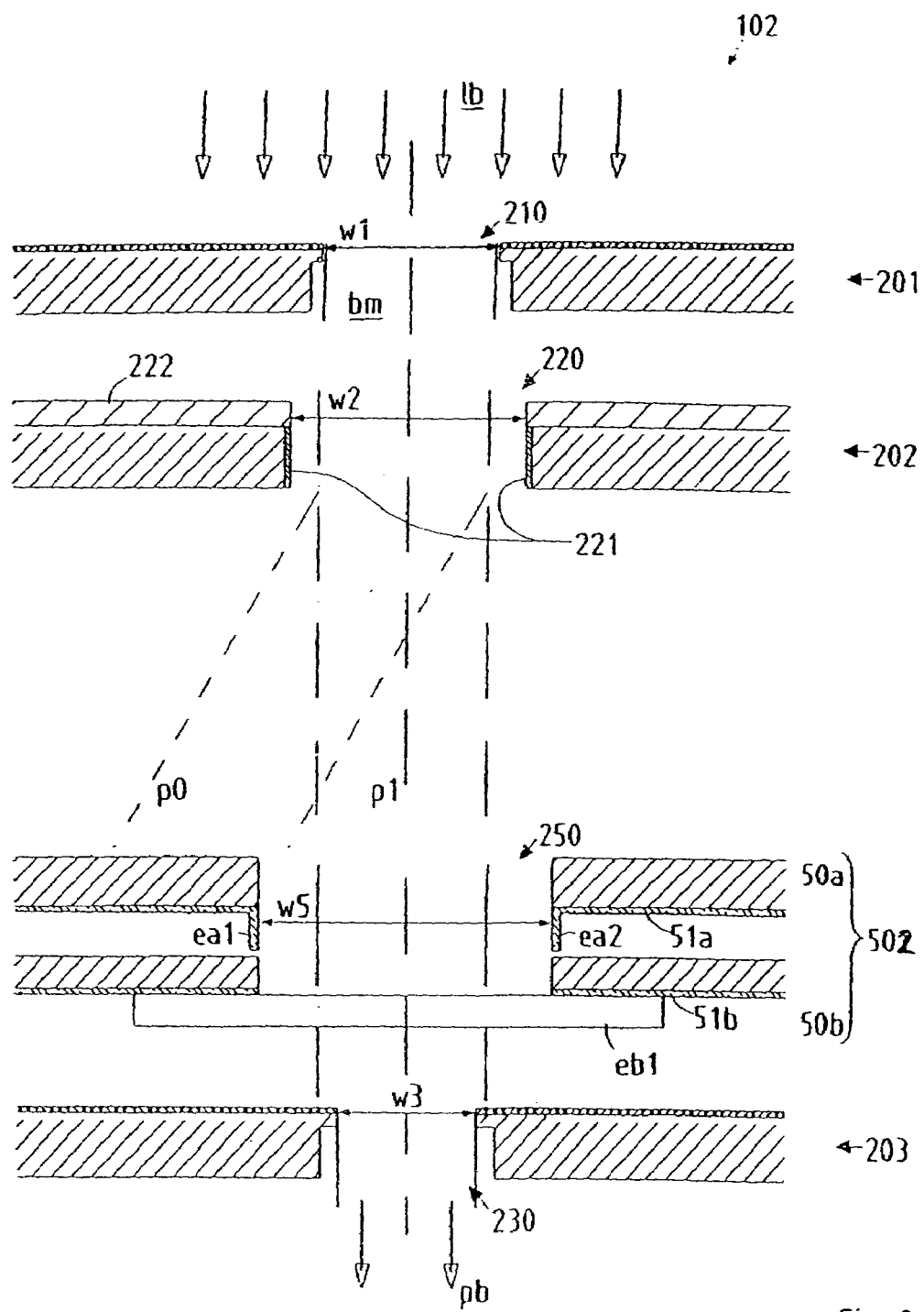
FIG. 8 a longitudinal section detail of a pattern definition device of a multi-beam system with an adjustment unit.
Figure 12:
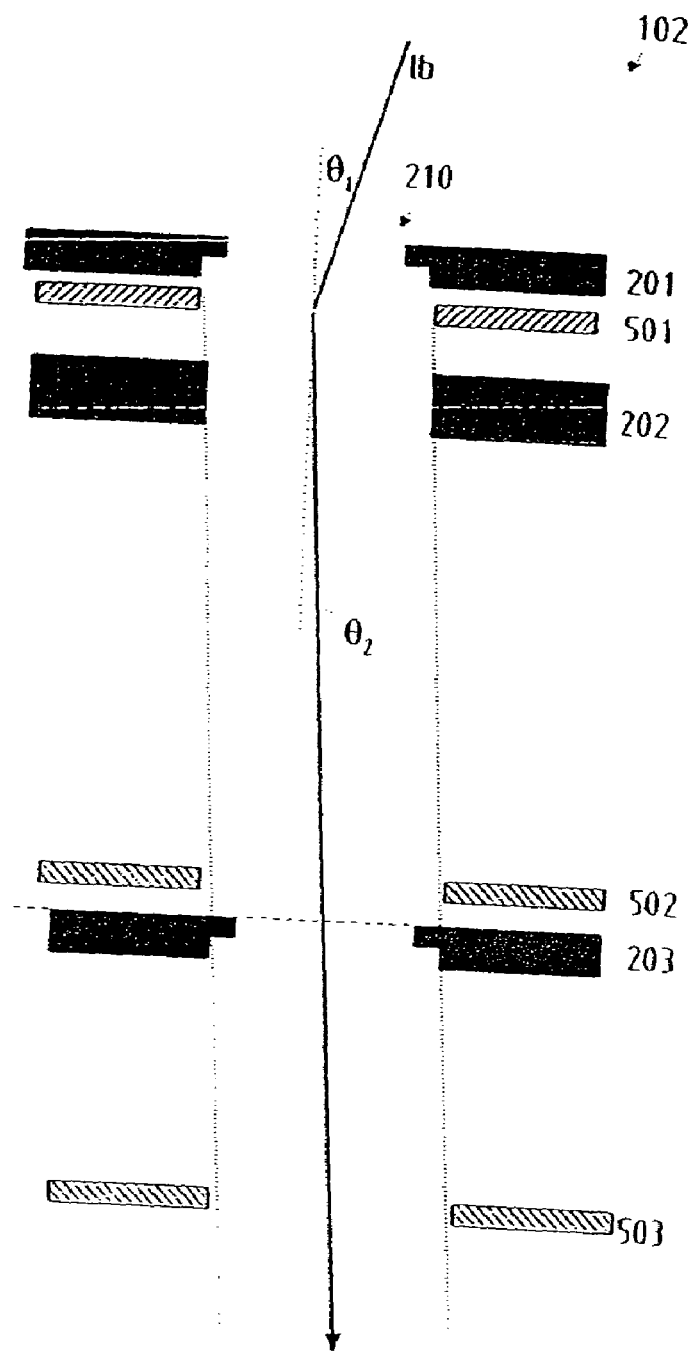
FIGS. 12 and 13 the function of deflection array means with respect to the optical properties of the multi-beam system.
Figure 13:
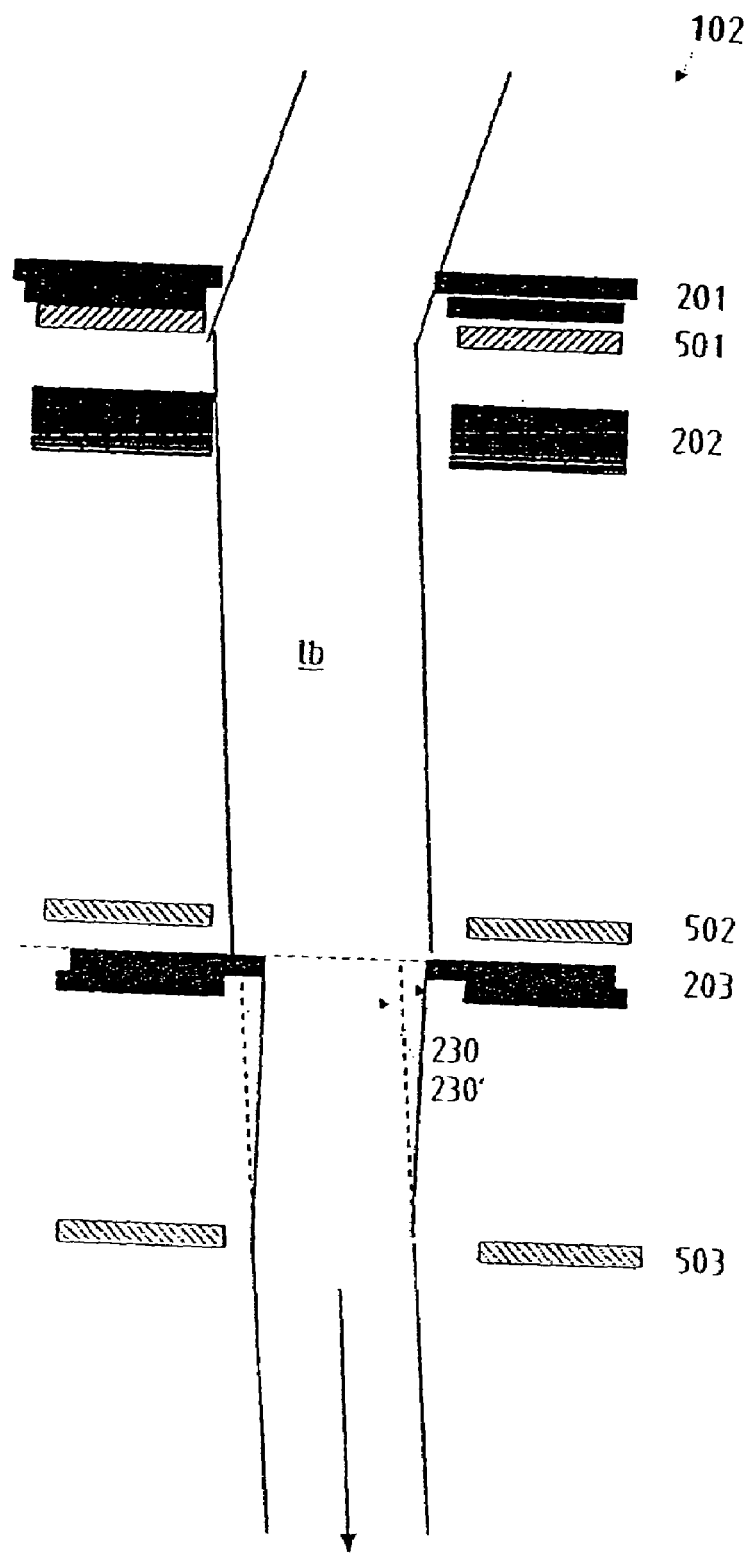

Preferably, an adjustment unit 502 is positioned immediately before the aperture plate 203 of the PD system as shown in FIGS. 8, 12 and 13. For a description of the function and operation of the PD device 20 and its components—in particular, the cover plate 201, blanking plate 202 and aperture plate 203—the reader is explicitly referred to the US-2003-0155534-A1.

The adjustment unit 502 can be realized as explained in the following with reference to FIGS. 8 to 17. Referring to FIG. 8, an adjustment unit 502 is composed of two deflector plates 50a, 50b, which each have conductor planes 51a, 51b comprising the electrodes and feeding lines at the "bottom" side (the side facing the target). The deflector plates 50a, 50b are aligned and fixed to each other by bonding or vacuum-compatible gluing. The electric contacts between the different conductor planes 51a, 51b are made by, for instance, wire bonding. The deflector plates are provided with an array of openings matching the apertures of the PD system, but having a width w5 which is well greater than the width w1 of the beamlet bm as defined by the cover plate 201.

Figure 16A:
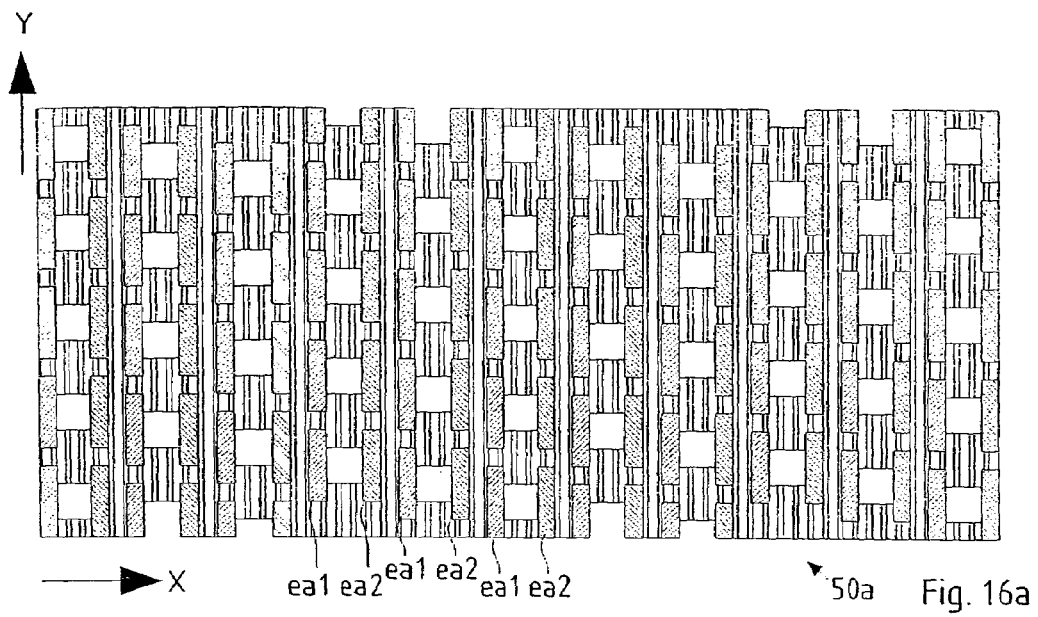
FIGS. 16a and 16b detail plan views of the arrangement of electrodes in a deflector array means according to the invention, organized in two deflector plates with the electrodes running in directions following the closest distance (X-direction)(FIG. 16a) and the second closest distance (Non-X-direction)(FIG. 16b)
Figure 16B:
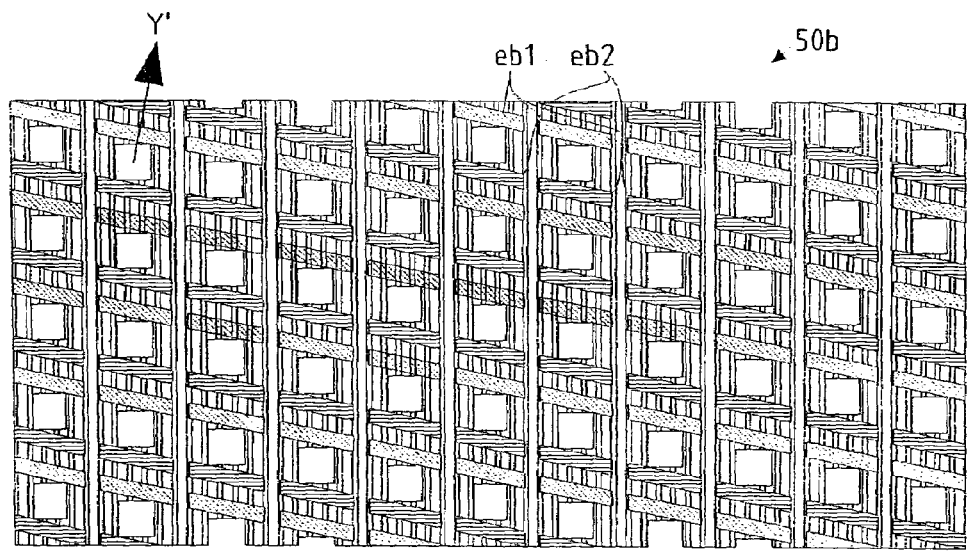

A plan view detail of one embodiment of the deflector plates 50a, 50b is shown in FIGS. 16a and 16b respectively. In each deflector plate 50a, 50b, a multitude of electrode pairs ea1, ea2, eb1, eb2 is realized in a manner that each of the openings 250 lies between the opposing electrodes of an electrode pair. Inducing a dipole electrical field between an electrode pair results in a change of the angle of the beamlet passing the opening in between with respect to the optical axis (Z-axis). Such a dipole field is formed by applying different electrostatic potentials to each electrode of a pair. Each of the electrode pairs ea1, ea2 of the deflector plate 50a (FIG. 16a) effects an angular change to the respective beamlet in, say, the X-direction, whereas the electrodes eb1, eb2 of the other deflector plate 50b serve to induce an angular change in another direction Y' in the X-Y-plane, sufficiently different from X-direction.

Figure 17A:
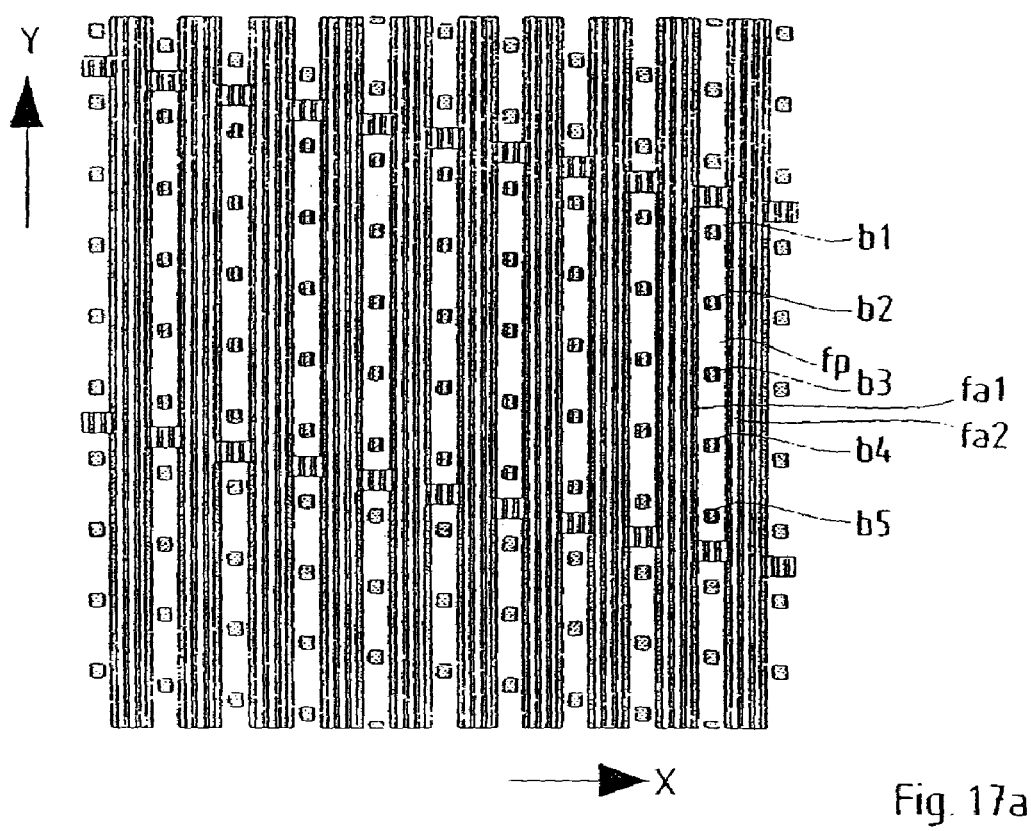
FIGS. 17a-17c a variant of the arrangement of the electrodes, with one electrode pair serving more than one aperture of the aperture array.
Figure 17B:
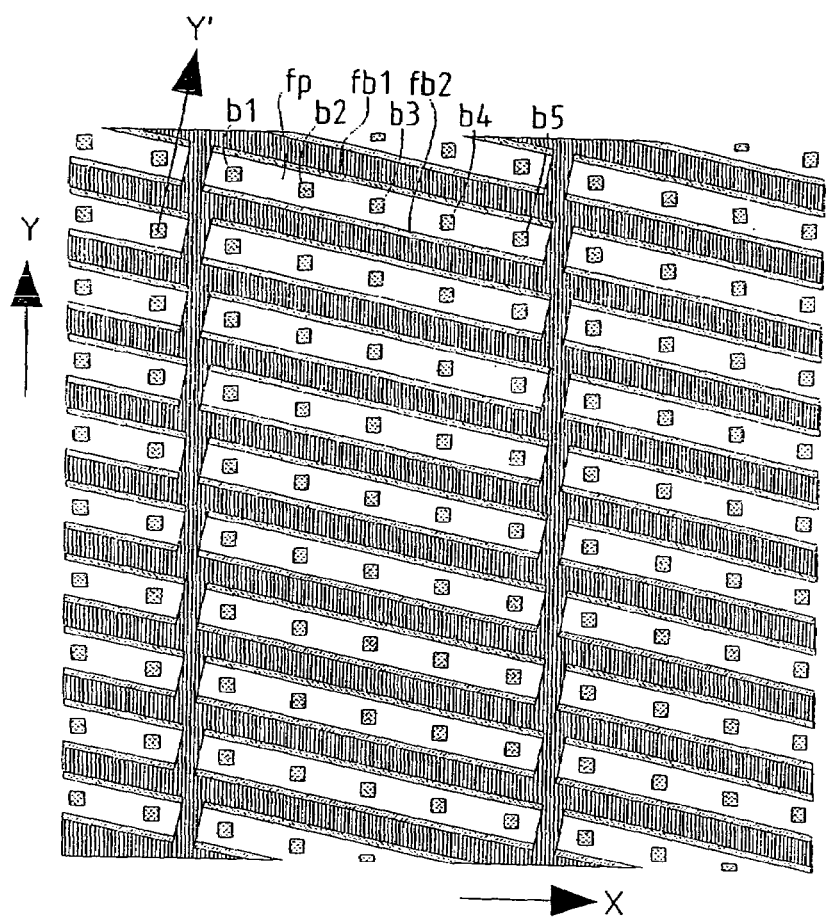

During one wafer exposure, the electric potentials applied to the electrodes of the adjustment unit 501 are practically constant over time or varying only slowly in order to adapt to varying substrate geometry during the process of the scanning of the substrate field (FIG. 4 of U.S.-2003-0155534-A1). Also, the spatial variation of the electric potentials within the adjustment unit (i.e., with regard to different x-y positions of the same adjustment unit) is slow as the required angular changes will vary only gradually. Therefore, in the embodiment shown here, as can be seen from FIGS. 16a and 16b, the electrode pairs are arranged in lines that follow the closest (FIG. 16a) and second closest (FIG. 16b) distance between neighboring openings. Due to the slow variation in angular deflection, this arrangement allows to apply the same potential to a group of n adjacent electrodes ea1 and ea2, respectively How the potentials are applied will be explained in more detail with reference to FIGS. 9 to 11. The number of electrodes that are grouped together must be small enough so that the resulting steps in the deflection (from one group to the next) are sufficiently low. The electrodes belonging to a group may also be formed as one set of common electrodes. This is shown in FIGS. 17a and 17b which show a variant in which not only an electrode pair serves several beamlets, but also only a single opening is provided between the electrodes for all the beamlets associated. FIGS. 17a and 17b relate to the arrangement for the X- and non-X-directions, respectively, where each electrode pair fa1, fa2, fb1, fb2 is used for five apertures. The electrodes are arranged at the long side of rectangular openings fp, through each of which five beamlets b1, . . . , b5 corresponding to the five apertures are deflected. Again, the number n of apertures that are grouped together must be small enough so that the resulting steps in the deflection (from one group to the next) are sufficiently low.

Figure 17C:
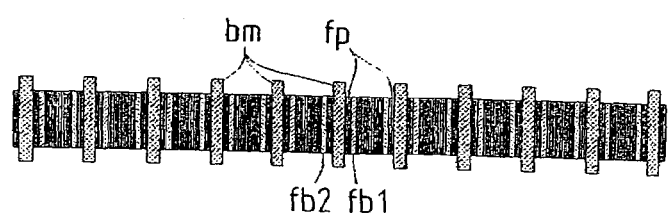

FIG. 17c shows a section through the plate of FIG. 17b along a Y direction, with the beamlets bm passing through the openings fp.

The fact that the deflector electrodes are arranged in corresponding lines, such as regular rows running in parallel (FIGS. 16 and 17) or concentric lines (FIG. 15), and that the field between them varies very slowly, strongly reduces the marginal effects perpendicular to the deflecting direction, or even avoids these effects completely in the case of the inner three (n-2) openings/beamlets between two electrodes of a pair shown in FIG. 17.

For the feeding of the potentials to the electrodes and, more specifically, for provision of a gradual variation of the potentials of the electrodes between the feeding points, various ways are possible.

Figure 9:
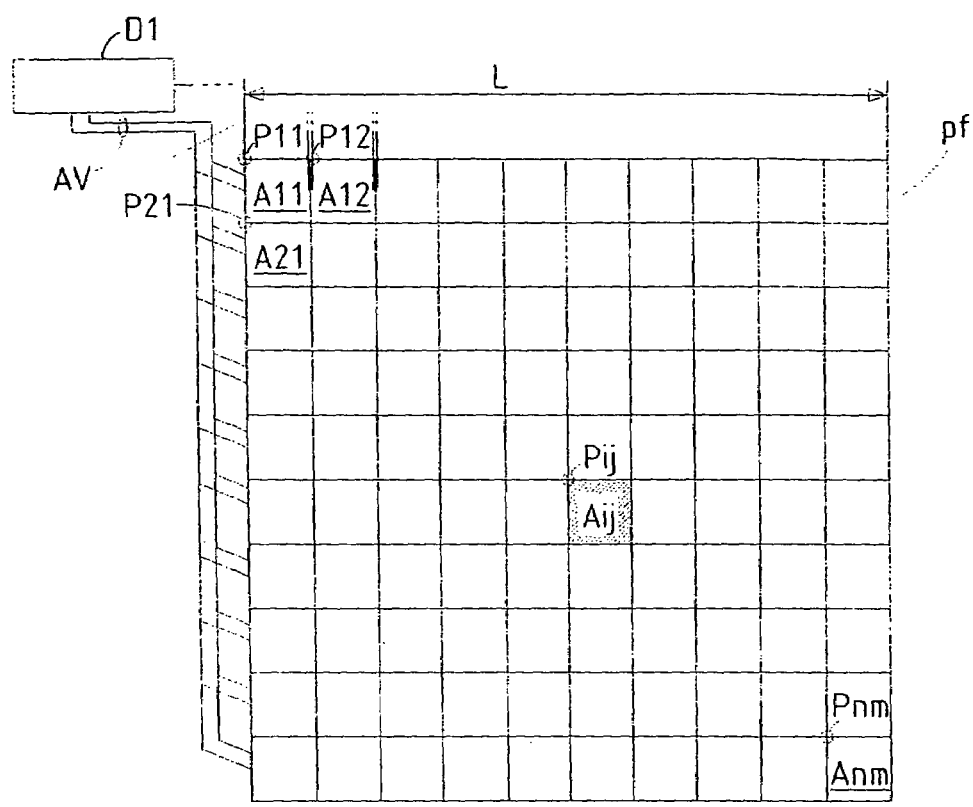
FIG. 9 a partitioning of the aperture field area into sub-areas for the electrostatic supply of the electrodes.

One way is to partition the entire aperture area in n×m sub-areas A11, A12, . . . Anm as shown in FIG. 9. Then the electrodes of the pairs in each of the sub-areas Aij (i= 1, . . . , n; j=1, . . . , m) are assigned the same potential differences. This is a sufficient approximation to a nominal function calculated from theoretical or experimental data if the variation of the electric potentials according to the nominal function is sufficiently low. Then, for each of the sub-areas Aij, the feeding potentials determined for a representative point in the sub-area is used. The representative point is taken as one of the edges, for instance the upper left edge, or the central point of the respective sub-area.

Figure 10:
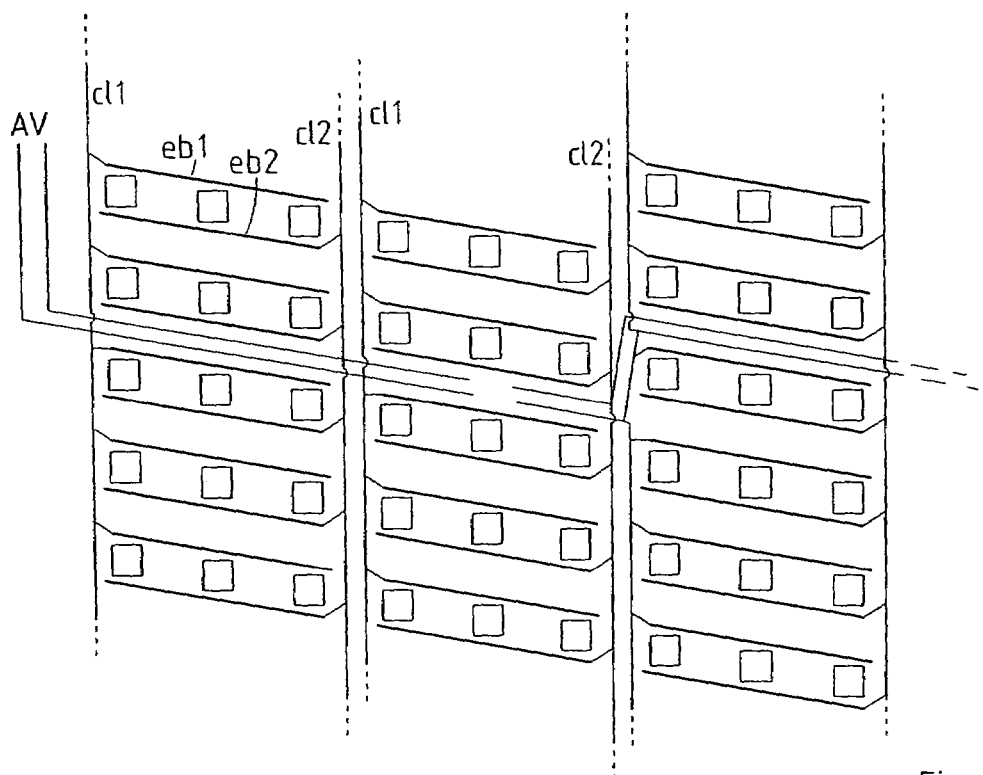
FIG. 10 a conductor line layout of the electrostatic supply of the electrodes of FIG. 7b.

In FIG. 9 the aperture area is divided into rectangular, almost square-shaped, sub-areas of equal size. The feeding connections for each of the sub-areas Aij are supplied from outside the deflector field to a feeding point Pij. The values of the potentials are fed as, for instance, digital signals through electric lines to digital-analog converters (DACs) D1 which convert the digital signals into analog voltage signals AV used as the feeding potentials for the electrodes. The distribution of the potentials to the respective electrodes is done using separate conductor lines c11, c12 for both polarities as shown in FIG. 10 for the non-X-type electrodes eb1, eb2 for groups of 3 openings. The conductor lines c11, c12 are located in different layers, separated from each other by insulator layers, on a wafer bulk substrate. The electrodes are connected with the respective conductor lines by means of contact points. For the production of the conductor lines and contact points state-of-the-art lithography and etch techniques can be used.

Figure 11A:
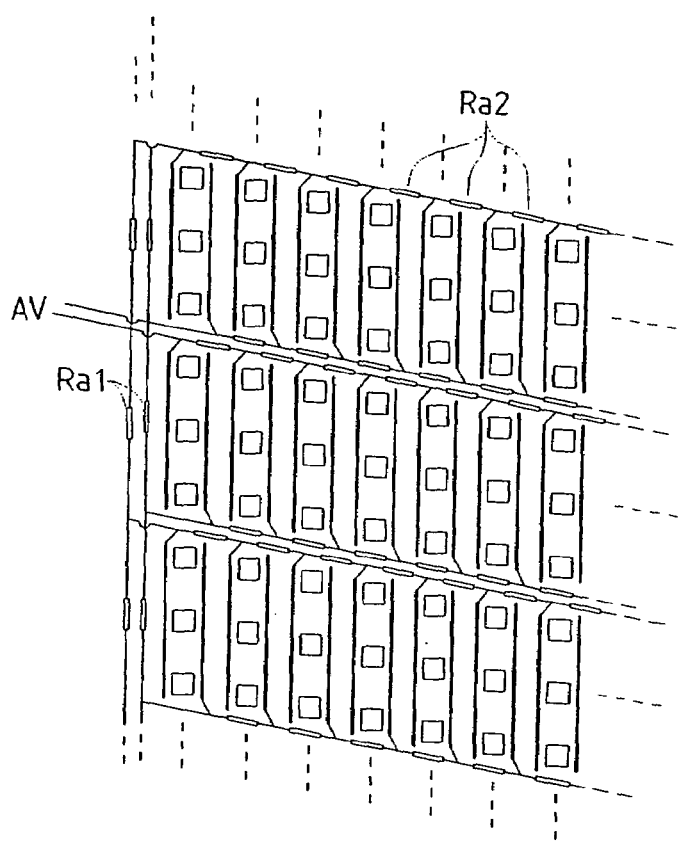
FIGS. 11a and 11b the electrostatic supply with resistor arrays for both types of electrodes.
Figure 11B:
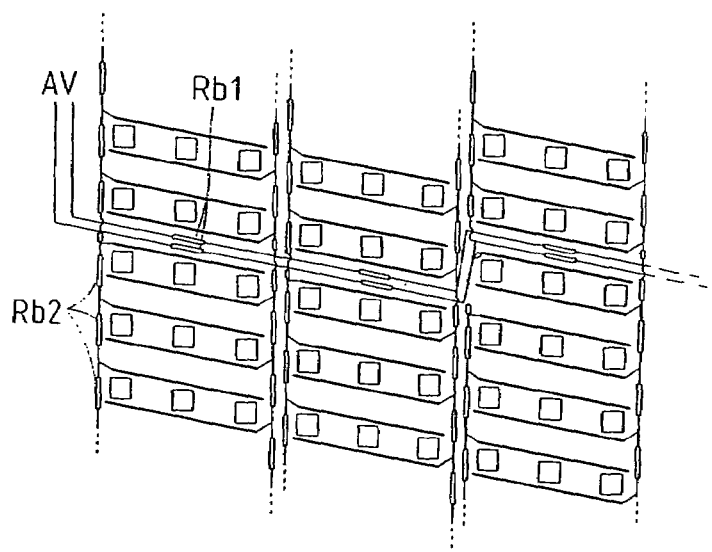

Another possibility is to use a resistor array in order to obtain a linear interpolation of the potentials between adjacent feeding points Pij. For each of the sub-areas Aij (i= 1, . . . , n; j=1, . . . , m) the four lattice points Pij, P(i+1)j, Pi(j+1), P(i+1)(j+1) are connected in the array. As shown in FIG. 11a for the example of X-type electrodes ea1, ea2, the linear function of the potential in the sub-area between the four lattice points is realized by means of a suitable arrangement of resistors Ra1, Ra2 between the contact points. FIG. 11b shows the analogous array of resistors Rb1, Rb2 for corresponding non-X-type electrodes eb1, eb2. For either polarity a resistor array is provided. The resistors Ra1, Ra2, Rb1, Rb2 are realized as a layer of resistive material of appropriate thickness and dimension as known from the state of the art.

In a further variant, the distribution of the potentials may be realized using a "continuous interpolation". Then for each polarity of the potentials one layer of a resist material is provided instead of the conductor lines described above. The feeding potentials are applied to the lattice points Pij, and a varying potential will establish which interpolates the values at the feeding points. The potential can then be taken at any set of points in the sub-area Aij as needed for supplying the electrodes of the respective polarity. For the production of the resistive layers and the feedthroughs state-of-the-art lithography and etch techniques can be used.

FIG. 12 illustrates the function of an adjustment unit 501 for compensation of illumination aberrations. In the case that the illumination system delivering the particle beam to the object does not produce an exactly telecentric beam, the beam will impinge at the cover plate 201 at an angle $\theta_1$ which will be dependent on the position of the beam on the plate (x-y-dependence). The adjustment unit 501 is positioned after the cover plate 201 and allows for a x-y-dependent compensation of the angle $\theta_1$, thus lifting the tolerance requirement with respect to telecentricity of the illuminating beam Ib.

Furthermore, with the help of the adjustment unit 501 a mis-alignment of the PD plates can be compensated, in particular, a mis-alignment of the type where the openings belonging to the same aperture are aligned along an axis which is not exactly parallel to the Z-axis, but at an angle $\theta_2$. Provided that the plates and the structures in them were defined in a corresponding manner, for instance using the same lithography tool for producing them, the relative position of the corresponding structures, in particular the openings 210, 220, 230 will match very well, i.e. with very low deviations of only a few nm. This allows to align the cover plate, blanking plate and aperture plate with respect to each other and to the particle beam in such a way that the particle beam exactly traverses the sequence of openings in the plates. The adjustment unit 501 compensates for a possible deviation of the (local) direction $\theta_1$ of the particle beam Ib and the (local) direction $\theta_2$ of the stacking axis of the openings. The deviation of the stacking direction from the ideal orthogonality (running parallel to the Z-axis) may be due to a tilting of the stack of plates, or due to a torsion of the stack around the Z-axis.

Referring to FIG. 13, an adjustment unit 502 (of the same layout as the unit 501) is positioned in front of the aperture plate 203. Its purpose is the reduction of geometric aberrations, such as image distortion, geometric blur (curvature of image plane) and astigmatic effects. It can also be used to modulate effects of space charge so that they can be corrected in combination with refocusing the particle beam. In order to obtain a high influence on the mentioned defects to be compensated, the adjustment unit 502 will be placed at a distance to the object as small as possible, i.e. at a very small distance to the aperture 230 in the aperture plate 203.

As mentioned with reference to FIGS. 1 and 2, the angles of the beamlet trajectories converge into a cross-over c before being formed to an image of the aperture array at the substrate plane. Due to the lens properties, this crossover will in general be aberrated, i.e. trajectories starting at the PD system with the same orientation do not focus to one point but will rather form a spherical aberration disk. The global space charge influence onto the image stems to a great extent from Coulomb interactions in the vicinity of the second crossover c. If this crossover is aberrated, the effect onto the image shape is not only a change of magnification but also additional distortion. Whereas the magnification change can be relatively easily corrected for by, e.g., changing the voltage of one or more electrode(s) in an electrostatic lens, the distortion caused by global space charge would cause additional blur in the final pattern on the substrate . With the aid of the adjustment unit 502 (FIGS. 12 and 13), the angles of the beamlets are adjusted so as to minimize the aberration of the crossover. By this measure, also the field curvature aberration of the system is reduced, i.e. the optical performance of the system is improved. The adjustment unit 502 also accounts for the possibility that the trajectories do not run within meridional planes (planes through the optical axis cx); this may be the case in particular if axial symmetric magnetic fields are used in the projection system. Of course, if an adjustment unit 503 is present after the aperture plate 230 as well, the effect of that plate and of the adjustment unit 502 will have to be considered in conjunction.

A third type of adjustment unit 503 (of the same layout as the unit 502), also shown in FIG. 13, may be provided at a position after the aperture plate 203. This unit 503 serves to correct deviations of the actual transfer function of the imaging system from the nominal transfer function, which deviations may be due to various reasons such as production defects, calculational limits or alignment deficiencies or external influence (for instance, external electromagnetic fields). It can also be used to correct the distortion of the projection optical system. The adjustment unit 503 produces a virtual object 230' different from the object as defined by the aperture 230, which is imaged onto the substrate. As a consequence of its function, namely, to shift the position of the object to be imaged laterally to the position as needed with the transfer function onto the image position as desired at the substrate, the unit 503 must be arranged after the object, i.e., after the aperture plate 203.

It should be noted that for the case that the trajectories will not deviate from the respective meridional planes, it will be sufficient to provide the adjustment units 501, 502 with a radial deflector arrangement only, rather than with a pair of deflectors. Then the deflectors will be realized with deflector plates oriented along rings running around the optical axis.

Figure 14:
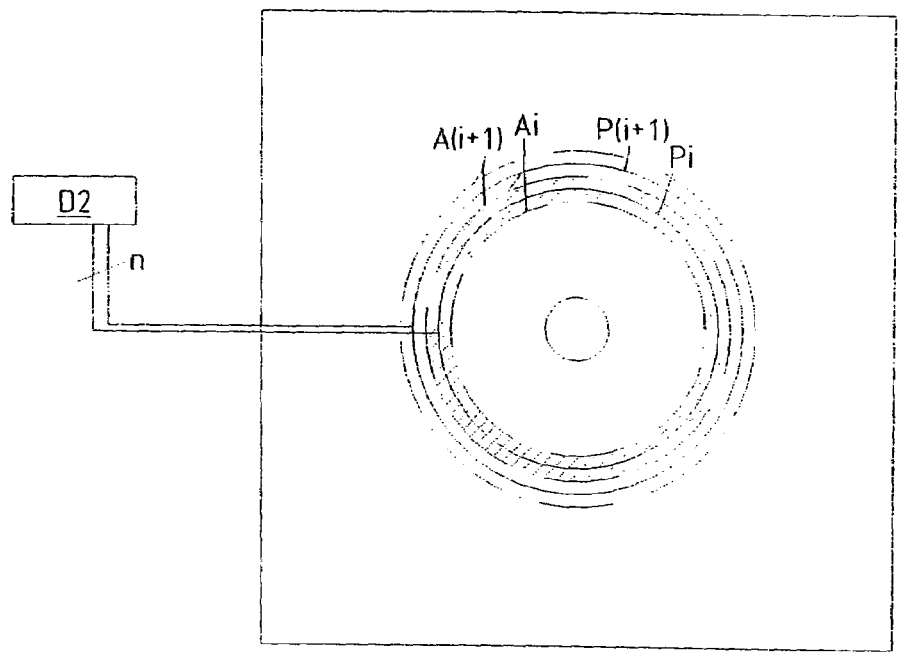
FIGS. 14 and 15 a "radial" variant of the electrode layout, with the corresponding partitioning of the electrodes into sub-areas (FIG. 14) and the supply with a resist array (FIG. 15).
Figure 15:
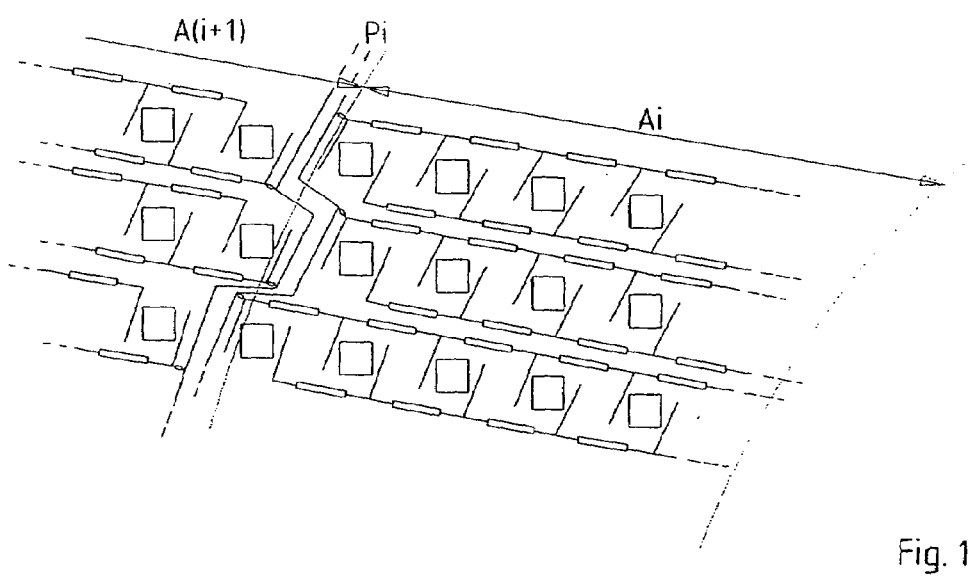

FIG. 14 shows an illustration of this 'radial' variant. The deflector electrodes are then oriented perpendicular to the radial direction ('tangential' direction), in order to ensure a radial deflection of the particles. The potential then has to vary in radial direction. Consequently, a partitioning into concentric ring-shaped sub-areas Ai (i =1, . . . n) is appropriate which surround the optical axis cx. For each of the sub-areas Ai, ring lines are provided for supplying the respective electrostatic potentials. The electrostatic potentials are generated, for instance, in the DAC D2 from digital data, and fed to the electrodes belonging to the rings Ai through the respective ring lines. Between the ring lines, the variation of the potential can again be constant, linear interpolated by means of, e.g., a resist array or a continuous interpolation with a resist layer. FIG. 15 shows a detail of a layout of the conductor lines with a resist array for a linear interpolation for a ring Ai and a portion of ring A(i+1).

What is claimed is:

1. A particle-optical projection system for imaging a pattern onto a target by means of energetic electrically charged particles in a particle-beam exposure apparatus, adapted to produce, from the pattern positioned at an object plane and represented in a patterned beam of said charged particles emerging from the object plane through at least one cross-over, an image of the pattern at the position of the target, with said image having a given size and distortion, said projection system comprising a multi-beam pattern definition means for defining the patterned beam with a time-variable pattern, having an aperture array means having a plurality of apertures defining the shape of beamlets permeating said apertures and at least one deflector array means separate from the aperture array means, with said deflector array means having a plurality of openings surrounding the beamlets, wherein for each opening or group of openings are provided at least two deflecting electrodes to which different electrostatic potentials are applicable, thus correcting the path of the beamlet passing through the respective opening according to a desired path through the device, wherein at least one of said deflector array means is adapted to adjust the angles of the beamlets passing the apertures to minimize the aberration of the crossover.

2. The projection system of claim 1, wherein said deflector array means is positioned immediately before the aperture array means.

3. The projection system of claim 1, wherein the multi-beam pattern definition means comprises a deflector array means which is adapted to produce a virtual object different from the object as defined by the apertures of the aperture array means.

4. The projection system of claim 1, wherein the multi-beam pattern definition means comprises a first deflector array means which is adapted to adjust the angles of the beamlets passing the apertures to minimize the aberration of the crossover, a second deflector array means which is adapted to produce a virtual object different from the object as defined by the aperture, said first and second deflector array means being adapted to adjust the position of the virtual object and the angles of the beamlets independently from each other.

5. The projection system of claim 1, wherein the modifications of said deflecting electrode potentials are calculated to compensate for the beam current influence upon the axial position of the image and the size of the image.

6. The projection system of claim 1, wherein the modifications of said deflecting electrode potentials are calculated to additionally compensate for the beam current influence upon the distortion of the image.

7. The projection system of claim 1, further comprising an electrostatic Einzel lens having an initial electrode, at least two central electrodes and a final electrode, wherein the central electrodes are adapted to be fed different electrostatic potentials, wherein the control means is adapted to calculate a beam current value corresponding to the entire patterned beam, calculate modifications of the electric potentials of said central electrodes suitable to compensate for the influence of said beam current value upon the geometric imaging properties of the projection system, with the difference between the potentials of the central electrodes being smaller than the difference between the potential of one of the central electrodes to the potential of the initial and the final electrode by at least an order of magnitude, and control the electric potentials of the central electrodes according to said modifications.

8. The projection system of claim 1, further comprising an particle-optical lens provided with adjustable positioning means for adjustment of the axial position of the lens as measured along the optical axis of the projection system, wherein the control means is adapted to calculate a beam current value corresponding to the entire patterned beam, calculate modifications of the axial position of said lens suitable to compensate for the influence of said beam current value upon the geometric imaging properties of the projection system, and control said axial positions according to said modifications by means of said positioning means.

9. The projection system of claim 8, wherein the positioning means are realized as piezoelectric actuators.

* * * * *